United States Patent
Shen et al.

(10) Patent No.: US 11,041,890 B2
(45) Date of Patent: Jun. 22, 2021

(54) CURRENT MEASUREMENT AT A SWITCHING AMPLIFIER OUTPUT

(71) Applicant: SYNAPTICS INCORPORATED, San Jose, CA (US)

(72) Inventors: Dan Shen, Irvine, CA (US); Lorenzo Crespi, Costa Mesa, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 550 days.

(21) Appl. No.: 15/789,907

(22) Filed: Oct. 20, 2017

(65) Prior Publication Data

US 2019/0120883 A1  Apr. 25, 2019

(51) Int. Cl.
| | | |
|---|---|---|
| *G01R 19/165* | (2006.01) | |
| *H02H 9/02* | (2006.01) | |
| *H04R 3/00* | (2006.01) | |
| *H03F 3/185* | (2006.01) | |
| *G11C 27/02* | (2006.01) | |
| *H03F 3/217* | (2006.01) | |

(52) U.S. Cl.
CPC ....... *G01R 19/16571* (2013.01); *H02H 9/025* (2013.01); *H03F 3/185* (2013.01); *H03F 3/217* (2013.01); *H03F 3/2173* (2013.01); *H04R 3/007* (2013.01); *G11C 27/024* (2013.01); *H04R 2499/11* (2013.01)

(58) Field of Classification Search
CPC .. G01R 19/16571; H02H 9/025; H03F 3/185; H03F 3/217; H03F 3/2173; H04R 3/007; H04R 2499/11; G11C 27/024
USPC ...................................................... 361/93.9
See application file for complete search history.

(56) References Cited

U.S. PATENT DOCUMENTS

| | | | |
|---|---|---|---|
| 6,865,417 B2* | 3/2005 | Rissmann ............ | A61N 1/3931 607/5 |
| 2002/0141098 A1* | 10/2002 | Schlager ................ | G11B 21/02 360/75 |
| 2012/0044020 A1 | 2/2012 | Siniscalchi et al. | |
| 2012/0229212 A1 | 9/2012 | Konecny et al. | |
| 2013/0135775 A1* | 5/2013 | Yao ........................ | H02H 9/025 361/18 |

(Continued)

FOREIGN PATENT DOCUMENTS

| | | |
|---|---|---|
| CN | 201490975 | 5/2010 |
| JP | 2005333636 | 12/2005 |

*Primary Examiner* — Kevin J Comber
(74) *Attorney, Agent, or Firm* — Haynes and Boone, LLP

(57) ABSTRACT

Systems and methods according to one or more embodiments are provided for sensing a current at an output of a switching amplifier. In one example, a system includes a first transistor switch coupled to a load configured to conduct a current in the load responsive to a first pulse width modulated control signal coupled to a gate terminal of the first transistor switch. The system further includes a second transistor switch configured to conduct the current in the load responsive to a second pulse width modulated control signal coupled to a gate terminal of the second transistor switch. A shielding switch is coupled between the load and a current sensing circuit, wherein the shielding switch is configured to provide a small signal voltage to the current sensing circuit in response to the second pulse width modulated control signal, the current sensing circuit is configured to sense the current traveling through the load responsive to the small signal voltage.

20 Claims, 5 Drawing Sheets

(56) References Cited

U.S. PATENT DOCUMENTS

2013/0223649 A1 8/2013 Srivastava et al.
2014/0062592 A1 3/2014 Chang et al.
2016/0336442 A1* 11/2016 Nielsen ........... H01L 21/823892
2017/0153278 A1 6/2017 Maschera et al.

* cited by examiner

US 11,041,890 B2

CURRENT MEASUREMENT AT A SWITCHING AMPLIFIER OUTPUT

TECHNICAL FIELD

The present disclosure, in accordance with one or more embodiments, relates generally to signal processing and, more particularly for example, to sensing a current at an output of a switching amplifier.

BACKGROUND

Many modern devices such as laptop computers, computer tablets, MP3 players, and smart phones use miniature speakers. In many applications, these devices utilize switching amplifiers to efficiently provide for amplification of an audio signal. In one example, a switching amplifier may provide twenty watts of power to amplify an audio signal and drive a speaker. Due to limitations of miniature speakers used in such devices, the current to the speakers may be measured to aid in the prevention of distortion, physical damage to the speaker and other unwanted effects. Thus, there is a continued need to improve the measurement of current provided to the speaker by the switching amplifier in order to protect the speaker from distortion or damage.

SUMMARY

The present disclosure provides systems and methods that address a need in the art for accurate sensing of a current provided to a load by a switching amplifier. The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

The present disclosure describes systems and methods that address a need for accurate measurement of a current provided by a switching amplifier such as a switching regulator or a class-D switching amplifier. In one embodiment, an audio system of the present disclosure includes a switching amplifier H-bridge output stage, and one or more output current measurement circuits. Each output current measurement circuit includes a current sensing component, such as a current mirror circuit, and a shielding switch arranged to provide for accurate measurement of the current traveling through a load during all phases of amplifier switching including switching amplifier output state transitions.

Embodiments of the present disclosure may be contrasted to pre-existing solutions for measuring a current at an output of a switching regulator or class-D switching amplifier. For example, conventional switching amplifier current sensing circuits may use a sense resistor installed in series with a load to sense a current traveling through the load. A sensing amplifier connected to the sensing resistor may require a relatively large common mode rejection ratio to process large switching amplifier output voltage variations at the sense resistor. Many passive current sense circuits reduce efficiencies in the operation of an H-bridge amplifier output stage through additional power dissipation losses within the system. Moreover, added power dissipation may cause thermal issues for applications that include switching amplifier circuits formed within an integrated circuit die.

Some conventional audio systems use a current mirror circuit for load current sensing measurements. However, performance of current mirror circuits may be affected by similar common mode limitations as discussed herein. For example, a conventional current mirror circuit used with switching amplifier applications may be subject to large voltage swings, requiring a current mirror circuit with a relatively high common mode rejection ratio. Moreover, the current mirror circuit does not provide an accurate current measurement when switching transistors are in transition between "on" and "off" states. Various embodiments of the present disclosure address these issues to accurately and effectively measure the current provided to the load by a switching amplifier in order to protect the load, such as a speaker, from distortion or damage.

Figure 1:
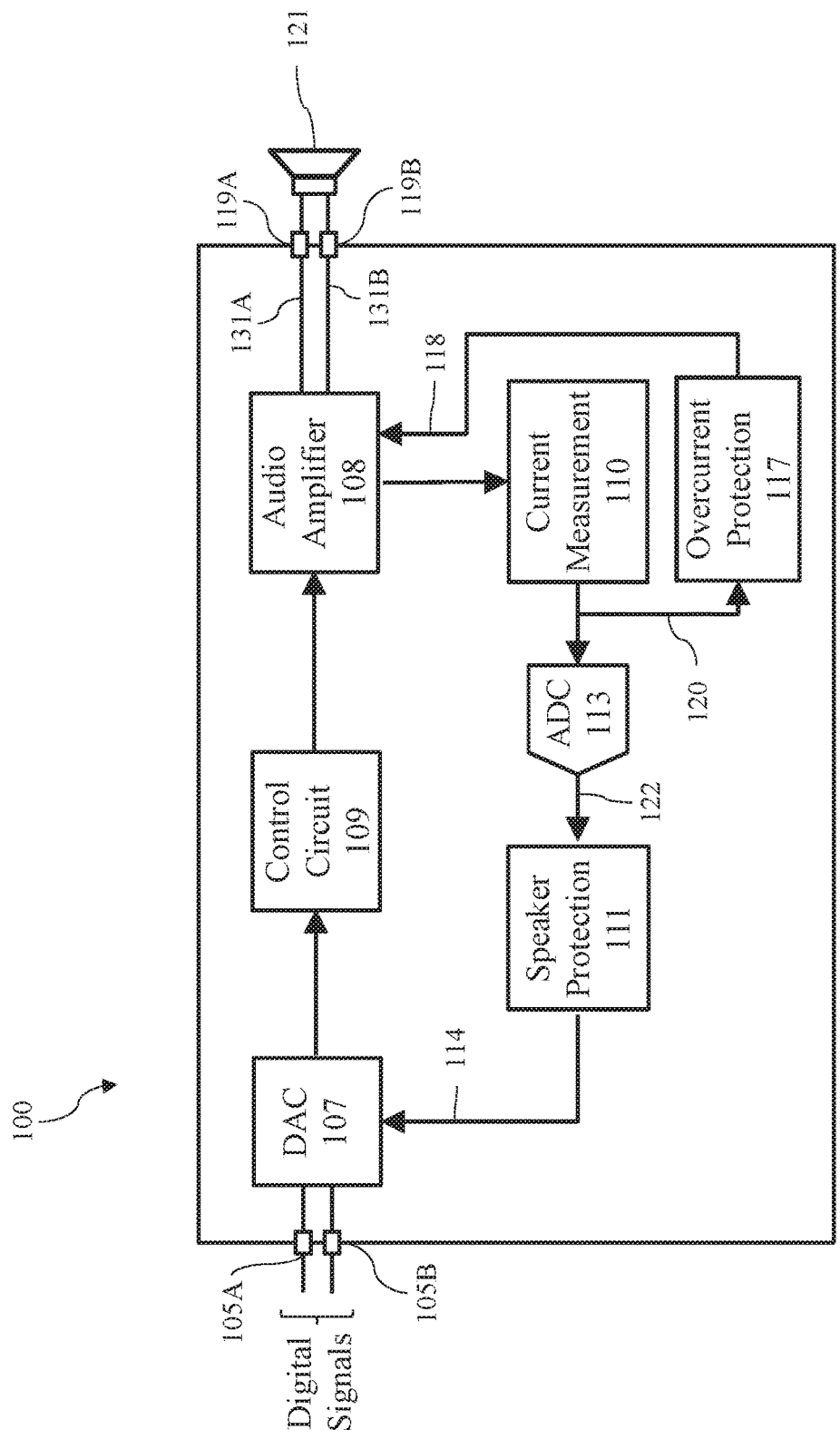
FIG. 1 illustrates an exemplary audio codec in accordance with one or more embodiments of the disclosure.

FIG. 1 illustrates a block diagram of an exemplary audio codec circuit 100 in accordance with one or more embodiments of the disclosure. Audio codec circuit 100 provides analog and digital circuitry for signal processing of audio inputs. Audio codec circuit 100 includes circuitry to process input digital signals and provide amplified output signals to a speaker, for example speaker 121. In some embodiments, audio codec circuit 100 receives digital signals at input ports 105A-B. Digital signals may be provided, for example, by any electronic device such as a laptop computer, a computer tablet, a smart phone, or a sensor such as a microphone.

Digital-to-analog converter (DAC) 107 may be configured to receive digital signals and convert the digital signals to analog signals for further processing. Control circuit 109 receives analog audio signals from DAC 107 and processes the analog audio signals. In some embodiments, control circuit 109 provides pulse width modulated signals to audio amplifier 108. In some embodiments, audio amplifier 108 is implemented as a class-D switching amplifier and pulse width modulated signals control a switching duty cycle of audio amplifier 108. Audio amplifier 108 amplifies the received analog audio signals and provides amplified audio signals 131A-B to drive an output device 121 at output jacks 119A-B. Output device 121 may be a loudspeaker, headphones or another electronic device for receiving the amplified audio signals 131A-B.

Audio amplifier 108 is electrically coupled to current measurement circuit 110. Current measurement circuit 110 is configured to sense the current signal traveling to output device 121 at a low side output switch of audio amplifier 108. In some embodiments, current measurement circuit 110 provides an approximation of the current of the current signal traveling through output device 121. In some embodiments, a current mirror circuit within current measurement circuit 110 provides for and measures the equivalent current. As illustrated, a measured current signal 120 is provided to an overcurrent protection circuit 117. In some embodiments, overcurrent protection circuit 117 adjusts a frequency of the pulse width modulated signals to reduce a magnitude of the current traveling to output device 121, if measured current signal 120 exceeds an upper current threshold. The upper current threshold may be the maximum current an output device 121 can withstand without distortion or physical damage and may be dependent on the materials and processes used to manufacture output device 121. For example, a miniature speaker used in modern electronic devices may be capable to withstand approximately five hundred milliampere steady state. In other embodiments, overcurrent protection circuit 117 provides an overcurrent control signal 118 to turn off audio amplifier 108 if the measured current signal 120 exceeds the upper current threshold.

Current measurement circuit 110 is operable to provide an equivalent current of the instantaneous current traveling to output device 121 while the low side output switch is active. Current measurement circuit 110 is also operable to provide an equivalent current of the load current when the low side output switch and the high side output switch are transitioning between an "on" and "off" state. In this regard, current measurement circuit 110 and overcurrent protection circuit 117 robustly protect output device 121 from instantaneous distortion or physical damage by comparing the measured current signal 120 to the upper current threshold and acting to adjust a current in response to the threshold being exceeded.

Current measurement circuit 110 may also provide an analog voltage equivalent of measured current signal 120 to a speaker protection circuit 111. In the illustrated embodiment, an analog-to-digital converter (ADC) 113 converts the analog voltage to a digital voltage signal 122 that represents the measured current signal 120. ADC 113 provides the digital voltage signal 122 to the speaker protection circuit 111 which further processes the digital voltage signal 122. In some embodiments, speaker protection circuit 111 provides DAC 107 with signals 114 to adjust DAC 107 signal processing based on measured current feedback to protect the speaker 121.

Figure 2:
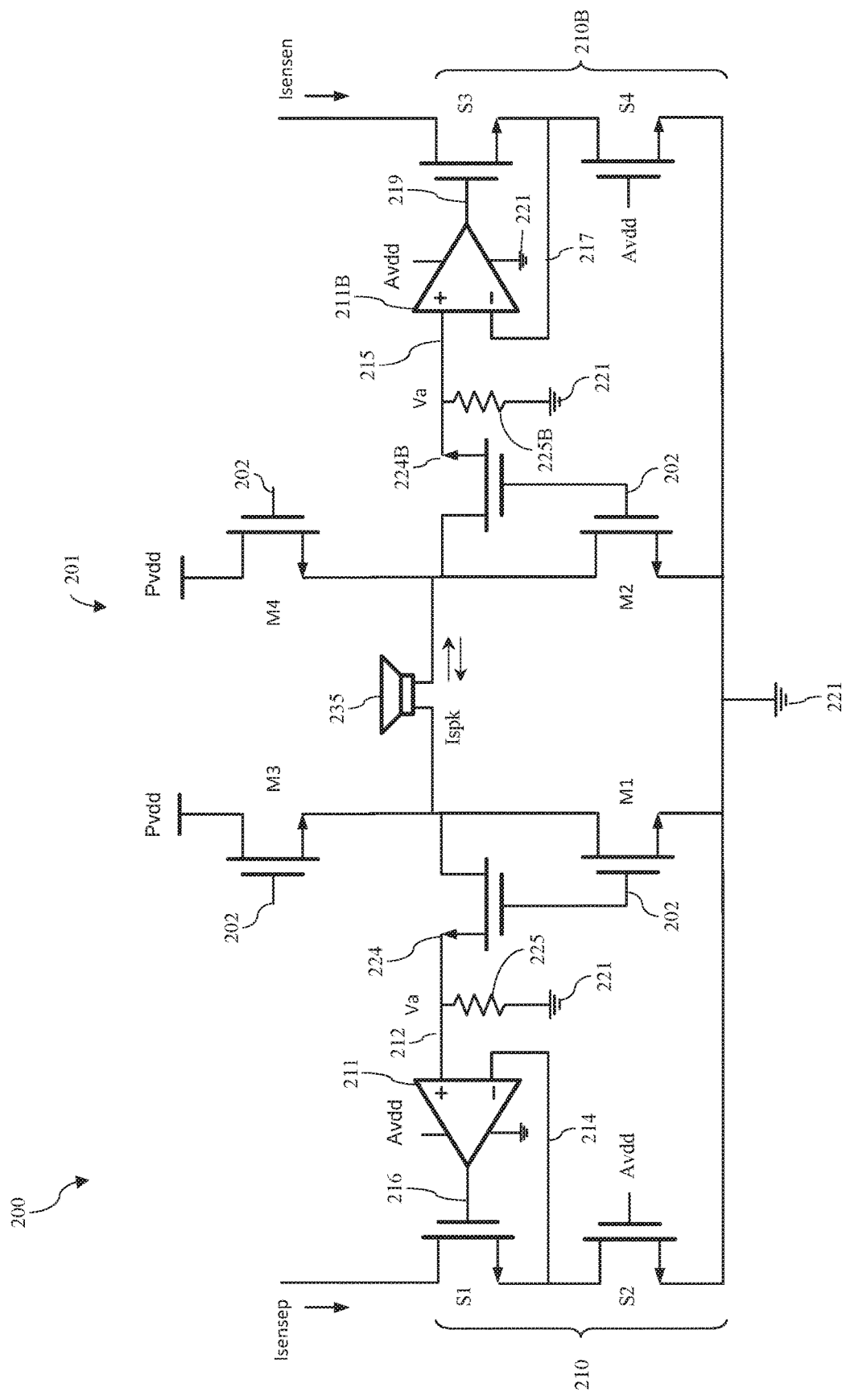
FIG. 2 illustrates a schematic diagram of an exemplary audio amplifier output driver in accordance with one or more embodiments of the disclosure.

FIG. 2 illustrates a schematic diagram of an exemplary audio amplifier output driver 200 in accordance with an embodiment of the disclosure. In some embodiments, audio amplifier output driver 200 forms part of audio amplifier 108 that is implemented in audio codec circuit 100. Audio amplifier output driver 200 provides an audio output to drive a speaker load 235, which may be implemented in a mobile phone, laptop computer, tablet, audio/video system, or other similar device. In various embodiments, audio amplifier output driver 200 is implemented as a class-D amplifier H-bridge output stage 201. Audio amplifier output driver 200 is coupled to one or more current measurement circuits 210.

As shown in FIG. 2, in some embodiments, H-bridge output stage 201 includes four n-channel laterally diffused metal oxide semiconductor field-effect transistors (MOSFET) M1, M2, M3, and M4. The respective drains of the first two high side transistors M3, M4 are connected to a supply voltage Pvdd. In some embodiments, supply voltage Pvdd provides twelve volts DC power to transistors M3, M4. However, other power supply voltages may be provides in other embodiments. The respective sources are connected to drains of two low side transistors M1, M2 whose sources are connected to ground signal 221. A speaker load 235 is connected between transistor switch pairs M3, M1 and M4, M2. Control circuit 109 of FIG. 1 may provide pulse width modulated control signals 202 to gates of transistors M1, M2, M3, and M4. In some embodiments, a first pulse width modulated (PMW) control signal 202 is connected to a gate terminal of transistor M3, a second PMW control signal 202 is connected to a gate terminal of transistor M1, a third PMW control signal 202 is connected to a gate terminal of transistor M4, and a fourth PMW control signal 202 is connected to a gate terminal of transistor M2.

In some embodiments, a first current measurement circuit 210 includes a current mirror amplifier 211 (e.g., a current sensing circuit), n-channel MOS transistors S1 and S2, a shielding switch 224, and a pull-down resistor 225. In this arrangement, the current Ispk traveling through speaker load 235 is represented by an equivalent measured current Isensep and Isensen.

Current mirror amplifier 211 includes two input terminals, non-inverting input terminal 212 and inverting input terminal 214. Non-inverting input terminal 212 is connected to a source terminal of shielding switch 224. A drain terminal of shielding switch 224 is connected to source terminal of transistor M3 (e.g., a first transistor switch) and drain terminal of transistor M1 (e.g., a second transistor switch). Inverting input terminal 214 of current mirror amplifier 211 is connected to source terminal of transistor S1 and drain terminal of transistor S2. Current mirror amplifier 211 output signal 216 is connected to gate terminal of transistor S1 to drive transistor S1. Source terminal of transistor S2 is connected to ground signal 221. Drain terminal of transistor S1 is connected to Isensep current signal.

Shielding switch 224 gate terminal is connected to gate terminal of low side transistor M1. As second PWM control signal 202 turns on transistor M1, shielding switch 224 turns on in response to second PWM control signal 202 and provides a small signal DC voltage at node Va that is equivalent to the voltage at drain terminal of M1. In some embodiments, small signal DC voltage is approximately fifty to one hundred millivolts. Node Va is connected to non-inverting input terminal of 212 of current mirror amplifier 211 to provide voltage Va to current mirror amplifier 211. Current mirror amplifier 211 output signal 216 controls a gate voltage of S1 to adjust a drain-source voltage across S2. In this regard, the voltage across transistor M1, and equivalently at node Va, is mirrored across transistor S1 to provide a Isensep current signal flowing through switches S1 and S2 that is approximately equal to load current Ispk. In some embodiments, current mirror amplifier 211 is implemented as a laterally diffused metal oxide semiconductor circuit. Pull-down resistor 225 is connected between node Va (e.g., at source terminal of shielding switch 224) and ground signal 221 to provide for a fast transition to zero volts at node Va when shielding switch 224 is turned off.

In some embodiments, a complementary second current measurement circuit 210B includes a current mirror amplifier 211B, n-channel MOS transistors S3 and S4, a shielding switch 224B, and a pull-down resistor 225B. Current Ispk traveling through speaker load 235 at the H-bridge complementary transistor pair (e.g., M4 and M2) is represented by an equivalent measured current Isensen.

Current mirror amplifier 211B includes two input terminals, non-inverting input terminal 215 and inverting input terminal 217. Non-inverting input terminal 215 is connected to a source terminal of shielding switch 224B. A drain terminal of shielding switch 224B is connected to source terminal of transistor M4 (e.g., a third transistor switch) and drain terminal of transistor M2 (e.g., a fourth transistor switch). Inverting input terminal 217 of current mirror amplifier 211B is connected to source terminal of transistor S3 and drain terminal of transistor S4. Current mirror amplifier 211B output signal 219 is connected to gate terminal of transistor S3 to drive transistor S3. Source terminal of transistor S4 is connected to ground signal 221. Drain terminal of transistor S1 is connected to Isensen current signal.

Shielding switch 224B gate terminal is connected to gate terminal of low side transistor M2. As fourth PWM control signal 202 turns on transistor M2, shielding switch 224B turns on in response to fourth PWM control signal 202 and provides a small signal DC voltage of approximately fifty millivolts at node Vab connected to source terminal of shielding switch 224B. Node Va is connected to non-inverting input terminal of 215 of current mirror amplifier 211B to provide voltage Va to current mirror amplifier 211B. Current mirror amplifier 211B output signal 219 controls a gate voltage of S3 to control a drain-source voltage at S4 and provide current Isensen that mirrors load current Ispk. Pull-down resistor 225B is connected between node Vab and ground signal 221 to provide for a fast transition to zero volts at node Vab when shielding switch 224b is turned off. Power supply Avdd is connected to gates of transistors S2 and S4 to turn on transistor S2 and S4 when audio amplifier output driver 200 is powered on.

As shown in FIG. 2, transistors S2 and S4 mirror the current flowing in speaker load 235, as discussed herein. Speaker load 235 is connected between source of M3 and drain of M1 on a first end and source of M4 and drain of M2 on a second end. Transistor S2 mirrors a current flowing through transistor M1 (e.g., a second transistor switch) during the PWM cycles when M1 is conducting. Transistor S4 mirrors a current flowing through transistor M2 (e.g., a fourth transistor switch) during the PWM cycles that M2 is conducting. In this regard, a speaker load 235 current is sensed for the complete range of Ispk current when Ispk flows through combined transistors M1 and M2.

Figure 3:
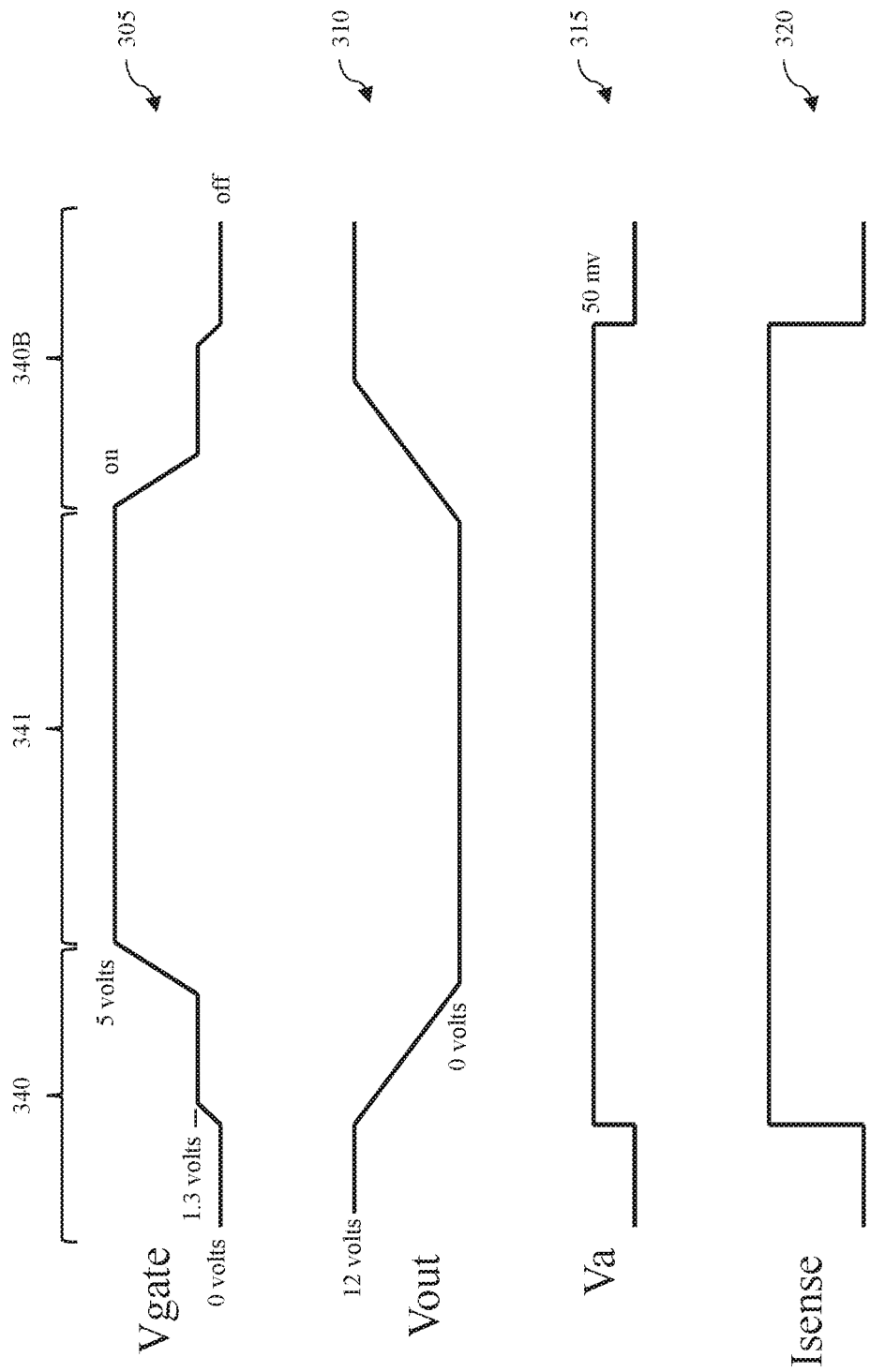
FIG. 3 illustrates exemplary plots of control voltages and sensed current of an audio amplifier output driver in accordance with an embodiment of the disclosure.

FIG. 3 illustrates plots of control voltages and sensed current of an audio amplifier output driver in accordance with an embodiment of the disclosure. FIG. 3 shows a plot 305 of gate voltage, Vgate, at gate terminals of transistor switch M1 and shielding switch 224 during a first transition 340 and a second transition 340B. As shown, first transition 340 illustrates Vgate transitioning from zero volts to five volts. Second transition 340B illustrates Vgate transitioning from five volts to zero volts. During first transition 340, transistor switch M3 (e.g., first transistor switch) is turning off and transistor switch M1 (e.g., second transistor switch) is turning on. During second transition 340B, transistor switch M3 (e.g., first transistor switch) is turning on and transistor switch M1 (e.g., second transistor switch) is turning off. Second PWM control signal 202 controls turn on and turn off of transistor switch M1 and shielding switch 224. Fourth PWM control signal 202 controls turn on and turn off of transistor switch M2 and shielding switch 224B.

Plot 310 illustrates a voltage, Vout, at source terminal M3 and drain terminal M1 during the same transitions of plot 305. Plot 310 shows Vout transitioning from twelve volts (e.g., Pvdd) to zero volts caused by PWM control signal 202 turning off transistor switch M3 and turning on transistor switch M1. Referring again to plot 305, the voltage at Vgate moves from zero volts to approximately 1.3 volts and finally to five volts during this same first transition 340.

Plot 315 illustrates node voltage Va during the same transitions 340 and 340B. As shown in plot 315, Va is a steady fifty millivolts during all transitions and including a transistor switch M1 "on" time during transition 341. In this regard, shielding switch 224 provides a small signal voltage (e.g., fifty millivolts) at non-inverting input terminal of current mirror amplifier 211 during transitions 340, 341, and 340B unaffected by voltage transitions of Vout and Vgate. Thus, as shown by plot 320, current measurement circuit 210 provides a measured Isensep value that is accurate and stable during transitions 340, 341, and 340B.

Figure 4:
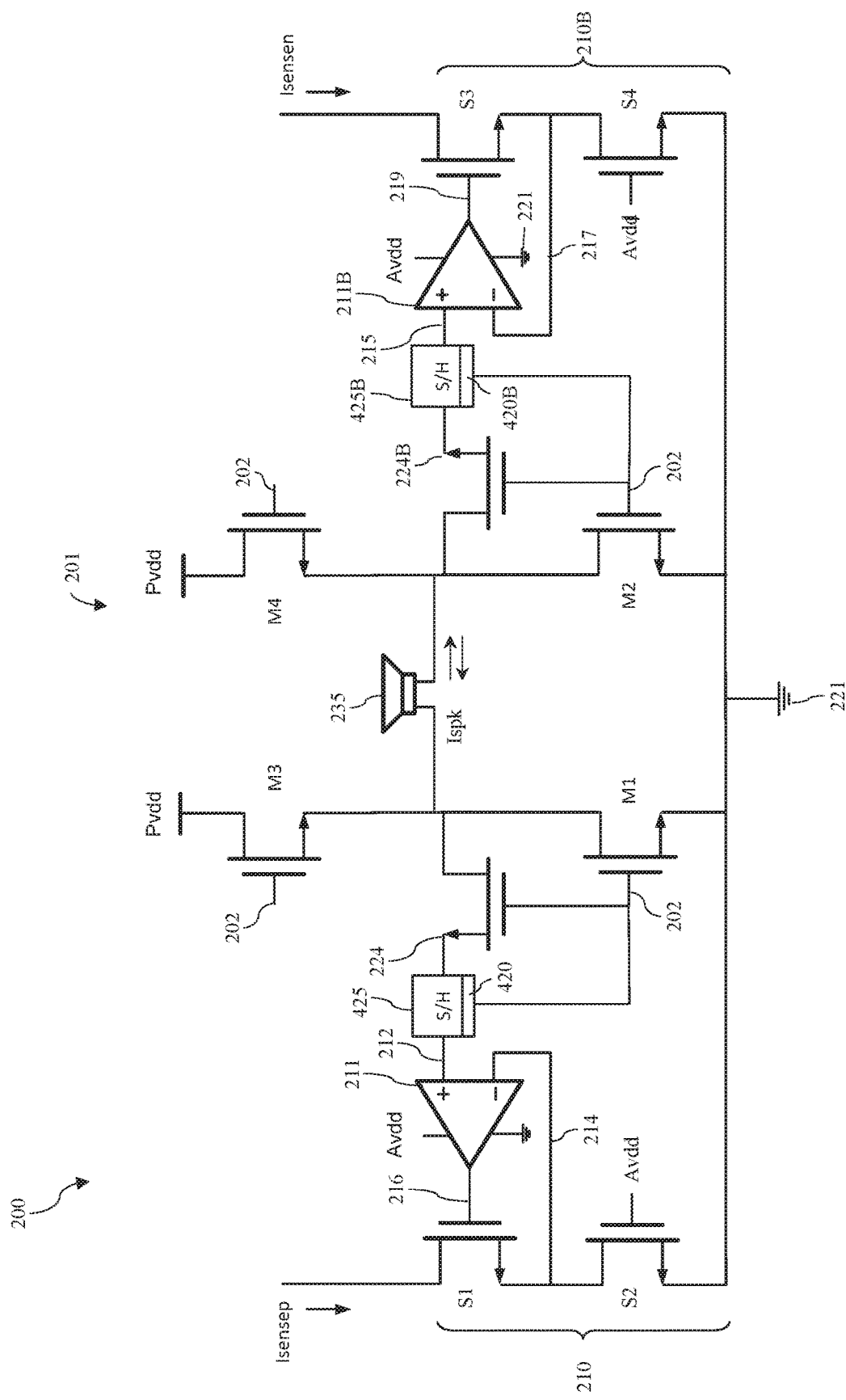
FIG. 4 illustrates a schematic diagram of an exemplary audio amplifier output driver including a sample and hold circuit in accordance with one or more embodiments of the disclosure.

FIG. 4 illustrates a schematic diagram of an exemplary audio amplifier output driver 200 including a sample and hold circuit 425 in accordance with an embodiment of the disclosure. Sample and hold circuit 425 is arranged to receive the small DC signal voltage (e.g., such as small signal DC voltage of approximately fifty millivolts) from the source of shielding switch 224 and provide the small DC signal voltage to the current mirror amplifier 211 for a pre-determined sample time period. As shown in FIG. 4, sample and hold circuit 425 is coupled between source terminal of shielding switch 224 and non-inverting input terminal 212 of current mirror amplifier 211.

In some embodiments, sample and hold circuit 425 is implemented as a capacitor, field effect transistor switch and an operational amplifier. For example, the operational amplifier charges or discharges the capacitor to approximately the voltage level at the input, such as the small signal voltage. The charged voltage is switched to an output of sample and hold circuit 425 and provided to non-inverting input terminal 212 of current mirror amplifier 211 for the pre-determined sample time period.

Sample and hold circuit 425 includes a trigger circuit 420 configured to provide the small signal voltage to the current mirror amplifier 211 in response to second modulated pulse control signal 202. In some embodiments, sample and hold circuit 425 is operable to provide the small signal voltage for a time equal to second modulated pulse control signal 202 time period. In other embodiments, the small signal voltage is provided to current mirror amplifier 211 for a time less than the time period of the second modulated pulse control signal 202. In this regard, sample and hold circuit 425 holds the small signal voltage at the current mirror amplifier 211 to enable measurement of current Isensep (e.g., or Isensen for the complementary circuit) for a pre-determined sample time period. Second current measurement circuit 210B includes a second sample and hold circuit 425B and its corresponding trigger circuit 420B connected between shielding switch 224B and current mirror amplifier 211B to perform the sample and hold function described herein.

Figure 5:
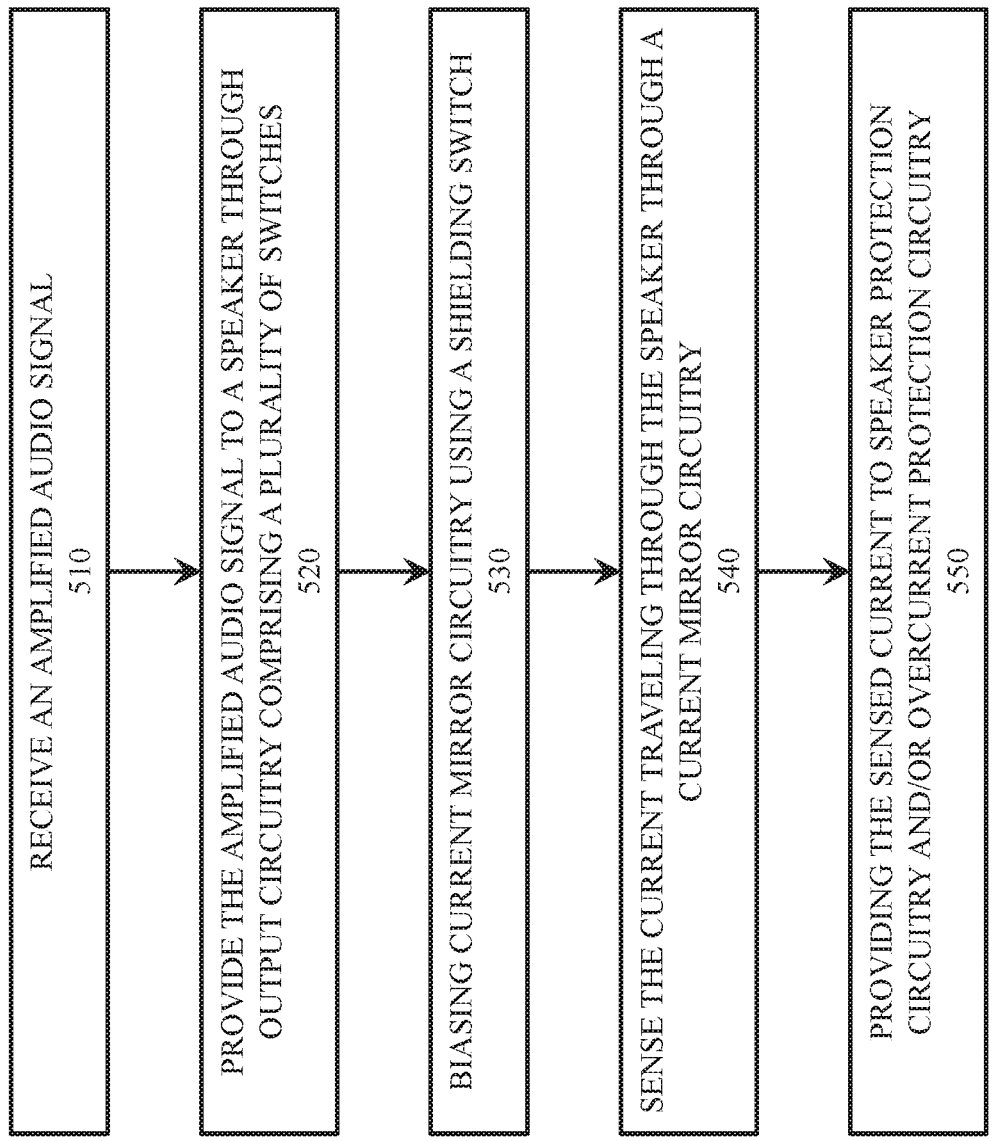
FIG. 5 illustrates an exemplary process flow for an audio amplifier output driver speaker protection system in accordance with one or more embodiments of the disclosure.

FIG. 5 illustrates an exemplary process flow for an audio amplifier output driver speaker protection system in accordance with an embodiment of the disclosure. In block 510, an amplified audio signal is received at an output of audio amplifier output driver 200. Audio amplifier output driver 200 includes an H-bridge output stage 201 including two high side/low side output transistor switch pairs, each pair connected to a respective end of speaker load 235 to conduct a current through speaker load 235. In some embodiments, each high side transistor switch is connected to a twelve volt DC power supply and each low side transistor switch is connected to ground signal 221 to drive speaker load 235.

In block 520, the flow diagram continues with providing the amplified audio signal to a speaker load 235. For example, a first pulse width modulated control signal is coupled to a gate terminal of a first transistor switch (e.g., high side switch M3) to control an "on" and "off" state of the first transistor switch. A second pulse width modulated control signal is coupled to a gate terminal of a second transistor switch (e.g., low side switch M1) to control an "on" and "off" state of the second transistor switch. H-bridge output stage 201 includes a complementary high side/low side transistor switch pair (e.g., M4/M2) connected to a second end of speaker load 235 and are controlled by complementary pulse width modulated control signals 202.

In block 530, the flow diagram continues with biasing current mirror circuitry using a shielding switch 224. Shielding switch 224 provides a small signal DC voltage (e.g., approximately fifty millivolts) at non-inverting input terminal of current mirror amplifier 211 to provide the small signal DC voltage at current mirror amplifier 211 non-inverting input terminal 212 during transitions between "off" and "on" states of the first and second switching transistors, and "on" state of second transistor switch (e.g., low side transistor switch). In this regard, shielding switch 224 provides a small signal voltage (e.g., fifty millivolts) unaffected by switching voltage transitions of transistor switches.

In block 540, the flow diagram continues with current measurement circuit 210 sensing the current traveling through speaker load 235. Current mirror amplifier 211 provides for accurate current measurements of a representative current signal, Isensep, that is approximately equal to the current flowing through speaker load 235. Current measurement circuit 210 provides a measured current value that is accurate and stable during transitions of switching transistors as a result of shielding switch 224, as discussed herein. H-bridge output stage 201 includes a complementary second current measurement circuit 210B configured to sense the equivalent speaker current Isensen at the complementary high side/low side switch pair. In this regard, a speaker load 235 current is sensed for the complete range of speaker current comprising Isensep and Isensen.

In block 550, current measurement circuit 210 provides the measured currents Isensep and Isensen to an overcurrent protection circuit 117. In some embodiments, overcurrent protection circuit 117 may adjust a frequency of the first and second pulse width modulated control signals to reduce the current traveling through the speaker load 235 when speaker current Ispk exceeds an upper current threshold.

In some embodiments, current measurement circuit 210 may provide analog voltage signals of measured currents Isensep and Isensen to an ADC 113 for conversion to digital sense signals that are passed to a speaker protection circuit 111. Speaker protection circuit 111 may process the digital sense signals and provide gain adjustments to DAC 107 to adjust a speaker load 235 current at outputs of audio amplifier output driver 200.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A system comprising:
 a first transistor switch coupled to a load configured to conduct a current in the load responsive to a first pulse width modulated control signal coupled to a gate terminal of the first transistor switch;
 a second transistor switch configured to conduct the current in the load responsive to a second pulse width modulated control signal coupled to a gate terminal of the second transistor switch;
 a shielding switch coupled between the load and a current sensing circuit, wherein a gate terminal of the shielding switch is coupled to the gate terminal of the second transistor switch and configured to provide a signal voltage to the current sensing circuit in response to the second pulse width modulated control signal, and wherein the current sensing circuit is configured to sense the current traveling through the load responsive to the signal voltage; and
 a sample and hold circuit coupled between the shielding switch and the current sensing circuit configured to provide the signal voltage to the current sensing circuit for a pre-determined sample time period in response to the second pulse width modulated control signal.

2. The system of claim 1, wherein the current sensing circuit is a current mirror circuit comprising an amplifier configured to measure a current approximately equal to the current traveling through the load, and wherein the signal voltage is approximately equal to a drain-source voltage of the second transistor switch.

3. The system of claim 2, wherein the shielding switch is further configured to provide the signal voltage to the current sensing circuit during a first transition comprising a time period when the first transistor switch is turning off and the second transistor switch is turning on, and during a second transition comprising a time period when the first transistor switch is turning on and the second transistor switch is turning off, wherein the shielding switch provides the signal voltage at a non-inverting input terminal of the amplifier.

4. The system of claim 2, wherein the current sensing circuit is coupled to an overcurrent protection circuit configured to provide the measured current to the overcurrent protection circuit, wherein the overcurrent protection circuit is configured to adjust a frequency of the first and second pulse width modulated control signals to reduce the current traveling through the load when the measured current exceeds an upper current threshold.

5. The system of claim 2, wherein the amplifier is configured as a laterally diffused metal oxide semiconductor circuit.

6. The system of claim 1, further comprising a pull-down resistor coupled between a source terminal of the shielding switch and a ground signal to provide a short transition to zero volts when the shielding switch is turned off.

7. The system of claim 1, wherein the load is configured as a speaker.

8. The system of claim 1, wherein the first and second transistor switches form at least a portion of a class-D amplifier H-bridge output stage.

9. The system of claim 1, the system further comprising:
a third transistor switch coupled to the load configured to conduct the current in the load responsive to a third pulse width modulated control signal coupled to a gate terminal of the third transistor switch;
a fourth transistor switch configured to conduct the current in the load responsive to a fourth pulse width modulated control signal coupled to a gate terminal of the fourth transistor switch; and
a second shielding switch coupled between the load and a second current sensing circuit, wherein the second shielding switch is configured to provide a second signal voltage to the second current sensing circuit in response to the fourth pulse width modulated control signal.

10. The system of claim 9, further comprising a second sample and hold circuit coupled between the second shielding switch and the second current sensing circuit configured to provide the second signal voltage to the second current sensing circuit for a pre-determined sample time period in response to the fourth pulse width modulated control signal.

11. The system of claim 1, wherein the first transistor switch, the second transistor switch, and the shielding switch are configured as n-channel laterally diffused metal oxide semiconductor field-effect transistors.

12. A method comprising:
conducting a current in a load responsive to a first pulse width modulated control signal coupled to a gate terminal of a first transistor switch;
conducting the current in the load responsive to a second pulse width modulated control signal coupled to a gate terminal of a second transistor switch;
providing a signal voltage to a current sensing circuit through a shielding switch coupled between the load and the current sensing circuit, wherein a gate terminal of the shielding switch is coupled to the gate terminal of the second transistor switch and configured to provide a signal voltage to the current sensing circuit in response to the second pulse width modulated control signal;
receiving the signal voltage at the current sensing circuit in response to the second pulse width modulated control signal to provide for sensing the current traveling through the load; and
receiving, from a sample and hold circuit coupled between the shielding switch and the current sensing circuit, the signal voltage at the current sensing circuit for a pre-determined sample time period in response to the second pulse width modulated control signal.

13. The method of claim 12, wherein the current sensing circuit is a current mirror circuit comprising an amplifier configured to measure a current approximately equal to the current traveling through the load, and wherein the sample and hold circuit is configured to provide the signal voltage at a non-inverting input terminal of the amplifier in response to the second pulse width modulated control signal.

14. The method of claim 13, further comprising:
receiving the signal voltage at the current sensing circuit during a first transition comprising a time period when the first transistor switch is turning off and the second transistor switch is turning on; and
receiving the signal voltage at the current sensing circuit during a second transition comprising a time period when the first transistor switch is turning on and the second transistor switch is turning off, wherein the sample and hold circuit provides the signal voltage at the non-inverting input terminal of the amplifier during the first and second transitions.

15. The method of claim 13, wherein the current sensing circuit is coupled to an overcurrent protection circuit configured to provide the measured current to the overcurrent protection circuit, and wherein the method further comprises adjusting a frequency of the first and second pulse width modulated control signals to reduce the current traveling through the load when the measured current exceeds an upper current threshold.

16. The method of claim 13, wherein the amplifier is configured as a laterally diffused metal oxide semiconductor circuit.

17. The method of claim 13, wherein the first and second transistor switches form at least a portion of a class-D amplifier H-bridge output stage.

18. The method of claim 13, further comprising a pull-down resistor coupled between a source terminal of the shielding switch and a ground signal to provide a short transition to zero volts when the shielding switch is turned off.

19. The method of claim 12, wherein the load is configured as a speaker.

20. The method of claim 12, wherein the first transistor switch, the second transistor switch, and the shielding switch are configured as n-channel laterally diffused metal oxide semiconductor field-effect transistors.

* * * * *